(12) United States Patent
White et al.

(10) Patent No.: US 11,612,051 B1
(45) Date of Patent: Mar. 21, 2023

(54) RADIO FREQUENCY (RF) SYSTEM WITH RF ISOLATION CHAMBERS AND METHOD OF MANUFACTURE

(71) Applicant: LOCKHEED MARTIN CORPORATION, Bethesda, MD (US)

(72) Inventors: Andrew E. White, Stratham, NH (US); James J. LaFrance, Bedford, NH (US); Thomas J. Clark, Bedford, NH (US); Richard K. Andrews, Hampton, NH (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 0 days.

(21) Appl. No.: 17/491,582

(22) Filed: Oct. 1, 2021

(51) Int. Cl.
*H05K 1/02* (2006.01)
*H05K 3/42* (2006.01)
*H01L 23/66* (2006.01)

(52) U.S. Cl.
CPC ........... *H05K 1/0222* (2013.01); *H01L 23/66* (2013.01); *H05K 3/429* (2013.01); *H05K 2201/068* (2013.01); *H05K 2201/09618* (2013.01); *H05K 2201/10098* (2013.01)

(58) Field of Classification Search
CPC ..... H05K 1/0219; H05K 1/0222; H05K 3/429
See application file for complete search history.

(56) References Cited

U.S. PATENT DOCUMENTS

| 4,658,334 A * | 4/1987 | McSparran | H05K 9/0039 174/262 |
|---|---|---|---|
| 8,022,861 B2 | 8/2011 | Margomenos | |
| 8,169,059 B2 | 5/2012 | Barth et al. | |
| 9,173,290 B2 | 10/2015 | McKinley et al. | |
| 9,435,838 B1 | 10/2016 | McKinley et al. | |
| 2007/0019760 A1 * | 1/2007 | Maligeorgos | H04B 15/02 375/327 |
| 2013/0256858 A1 * | 10/2013 | Komposch | H01L 23/06 257/676 |

* cited by examiner

*Primary Examiner* — Jeremy C Norris
(74) *Attorney, Agent, or Firm* — Terry M. Sanks, Esq.; Beusse Sanks, PLLC (57) ABSTRACT

A system includes a printed circuit board (PCB). The PCB includes a radio frequency (RF) circuit that includes a plurality of circuit modules and signal trace lines. Each circuit module is electrically connected to at least one other circuit module by a signal trace line. The system includes a via fence comprising fence walls having at least two materials laminated using a printed wire board (PWB) process. The fence walls include a plurality of vias. The fence walls form a plurality of free-form RF isolation chambers, each chamber includes chamber walls that surround each circuit module outside of the PCB. The embodiments also include a method of manufacturing and/or isolating the system or components of the system.

18 Claims, 9 Drawing Sheets

FIG. 9

RADIO FREQUENCY (RF) SYSTEM WITH RF ISOLATION CHAMBERS AND METHOD OF MANUFACTURE

BACKGROUND

Embodiments relate to a radio frequency (RF) system with RF isolation chambers and method of manufacture.

Radio frequency circuit components operating in a high-frequency environment are prone to noise signals that can deteriorate the performance of the circuit. Various techniques have been attempted to reduce the noise signals or separate frequencies in a printed wire board (PWB). Radio frequency circuit components are designed to meet certain specifications to meet or exceed temperature tolerances and vibrational forces. Radio frequency circuit components are designed to meet certain frequency bands and/or frequency separations, such as when the device integrates multiple frequencies of operation.

The disclosure provides techniques that are an improvement over known techniques to address noise signals or frequency separation.

SUMMARY

Embodiments relate to a radio frequency (RF) system with free-form RF isolation chambers and method of manufacture.

An aspect of the disclosure includes a system that includes a printed circuit board (PCB) having a radio frequency (RF) circuit. The circuit includes a plurality of circuit modules and signal trace lines, each circuit module being electrically connected to at least one other circuit module by a signal trace line. The system includes a via fence comprising fence walls having at least two materials laminated using a printed wire board (PWB) process and a plurality of vias formed in the walls. The fence walls form a plurality of free-form RF isolation chambers and each chamber includes chamber walls that surround each circuit module outside of the PCB.

Another aspect of the disclosure includes a method that includes forming a printed circuit board (PCB) comprising a radio frequency (RF) circuit. The circuit includes a plurality of circuit modules and signal trace lines. Each circuit module is electrically connected to at least one other circuit module by a signal trace line. The method includes forming a via fence including fence walls having at least two materials laminated using a printed wire board (PWB) process and a plurality of vias formed therein. The fence walls form a plurality of free-form chambers and each chamber includes chamber walls that surround each circuit module outside of the PCB.

BRIEF DESCRIPTION OF THE DRAWINGS

A more particular description briefly stated above will be rendered by reference to specific embodiments thereof that are illustrated in the appended drawings. Understanding that these drawings depict only typical embodiments and are not therefore to be considered to be limiting of its scope, the embodiments will be described and explained with additional specificity and detail through the use of the accompanying drawings in which.

DETAILED DESCRIPTION

The embodiments are directed to a radio frequency circuit that includes a printed wire board (PWB) isolation wall that forms a via fence made of PWB fabrication techniques to provide RF isolation of circuit modules outside of the PWB. A flat conductive cover may be used to complete the predetermined isolation chambers.

Embodiments are described herein with reference to the attached figures wherein like reference numerals are used throughout the figures to designate similar or equivalent elements. The figures are not drawn to scale and they are provided merely to illustrate aspects disclosed herein. Several disclosed aspects are described below with reference to non-limiting example applications for illustration. It should be understood that numerous specific details, relationships, and methods are set forth to provide a full understanding of the embodiments disclosed herein. One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. The embodiments are not limited by the illustrated ordering of acts or events, as some acts may occur in different orders and/or concurrently with other acts or events. Furthermore, not all illustrated acts or events are required to implement a methodology in accordance with the embodiments.

Notwithstanding that the numerical ranges and parameters setting forth the broad scope are approximations, the numerical values set forth in specific non-limiting examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 4.

As defined herein the term printed wire board (PWB) refers to the circuit board without electronic components.

The term printed circuit board (PCB) includes the circuit board or PWB with electronic components. PWB may also refer to a circuit card assembly (CCA). Typically, PWB s are constructed of material cores (metal/dielectric/metal) that may be laminated together. For example, lamination processes may use pregs (a dielectric glue to hold the cores together to form a core stackup). The processes for creating and laminating material cores together are known to individuals with ordinary skill in the art of PWB manufacture. A PWB stack may include National Electrical Manufacturers Association (NEMA) class FR4 materials for a core substrate. FR4 is generally known as a glass-reinforced epoxy laminate material. Nonetheless, the embodiments herein are not limited to FR4 material, but other dielectric materials. The core substrate of a PWB may use composite epoxy material (CEM), such as CEM-3, which includes woven glass fabric surfaces. CEM-3 may include a non-woven glass core combined with an epoxy synthetic resin. The PWB may use other materials such as, without limitation, ceramics, phenol-based resin, Polytetrafluoroethylene (PTFE) such as Teflon®, or fiberglass. The PCB may be made of materials suitable for a high-frequency environment such as frequencies in range which exceed 1 GHz, for example.

The PWB stack may include metallization layers made of copper (Cu). In some embodiments, the PCB may include a ground layer, made of gold (Au), silver (Ag), aluminum (Al) or copper (Cu), for example.

Figure 1A:
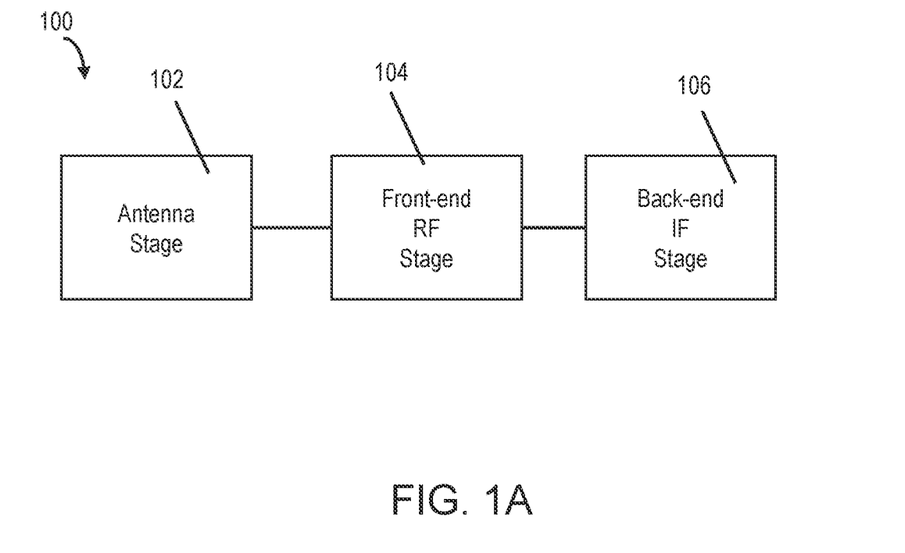
FIG. 1A illustrates a block diagram of a radio frequency (RF) system in accordance with an embodiment.

FIG. 1A illustrates a block diagram of a radio frequency (RF) system 100. The RF system 100 may include an antenna stage 102 and a front-end RF stage 104 being coupled to the antenna stage 102. The RF system 100 may include a back-end intermediate frequency (IF) stage 106. The front-end RF stage 104 may include a receiver with a down-converter to convert the RF signal to an IF signal. The back-end IF stage 106 may include a demodulator, for example. In general, the radio frequency spectrum is from 30 Hz to 300 GHz (gigahertz). While the embodiments are directed to a receiver, transmitter, or transceiver, the disclosure has applications for other circuits that would benefit from radio frequency isolation and, especially, in the high-frequency range.

In various embodiments, the system 100 may include a transmitter. In such a configuration, the back-end IF stage 106 may include a modulator, for example. Also, the front-end RF stage 104 may include an upconverter to convert the IF signal from the back-end IF stage 106 to a radio frequency.

The front-end RF stage 104 may be described in relation to layers and components and therefore will sometimes be referred to as front-end RF stage 104', front-end RF stage 104'', and front-end RF stage 104''', for example, to distinguish the different layers and components.

Figure 1B:
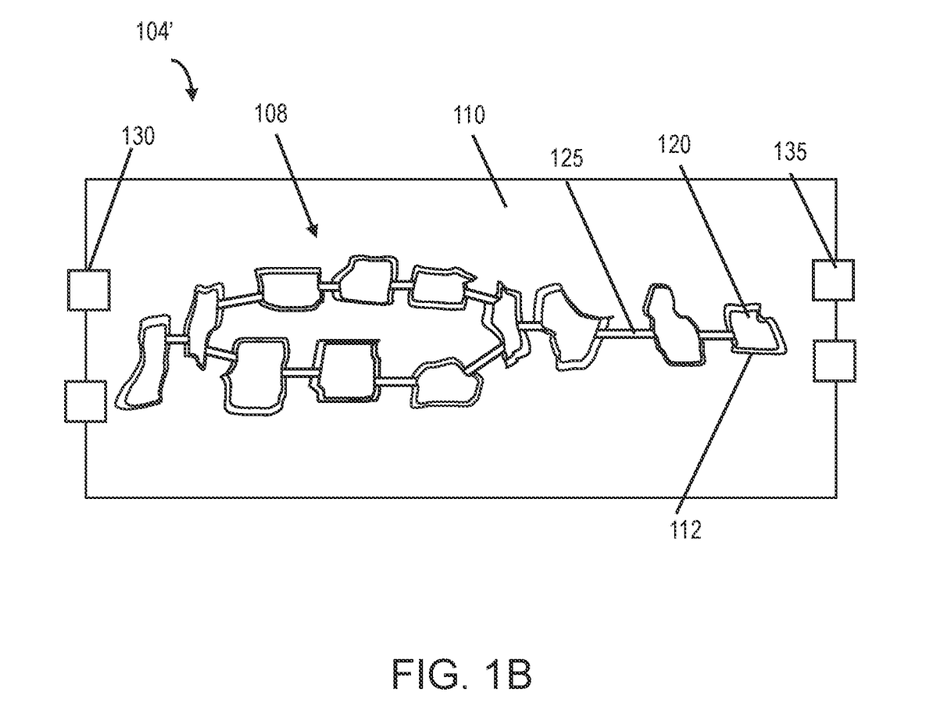
FIG. 1B illustrates a top view of a schematic diagram of an example component circuit of a front-end RF stage of FIG. 1A.

FIG. 1B illustrates a top view of a schematic diagram of an example component circuit 108 of a front-end RF stage 104' of FIG. 1A. The example circuit component 108 may include a plurality of circuit modules 120 and signal trace lines 125. Each circuit module 120 may be electrically connected to at least one other circuit module by a signal trace line 125. The circuit components 108 may include connectors 130 and 135. In some embodiments, the connectors 130 may be coupled to an antenna stage 102 of an RF system 100 of FIG. 1A. In some embodiments, the connectors 135 may be coupled to the back-end IF stage 106 (FIG. 1A).

The example circuit component 108 may include a ground layer 110 with a plurality of cutouts 112. In some embodiments, each cutout 112 may be configured to receive therethrough a raised portion of a corresponding one circuit module 120. For example, there may be a one-to-one correspondence between a cutout 112 and a circuit module 120. The component circuit 108 may include circuits that function as an RF receiver, RF transmitter or RF transceiver, for example. The component circuit 108 may be an analog RF receiver or a digital RF receiver. The plurality of circuit modules 120 may be manufactured using printed wire board (PWB) construction having a top ground layer 110. A portion of the circuit modules 120 extends above a plane of the ground layer 110.

Figure 2A:
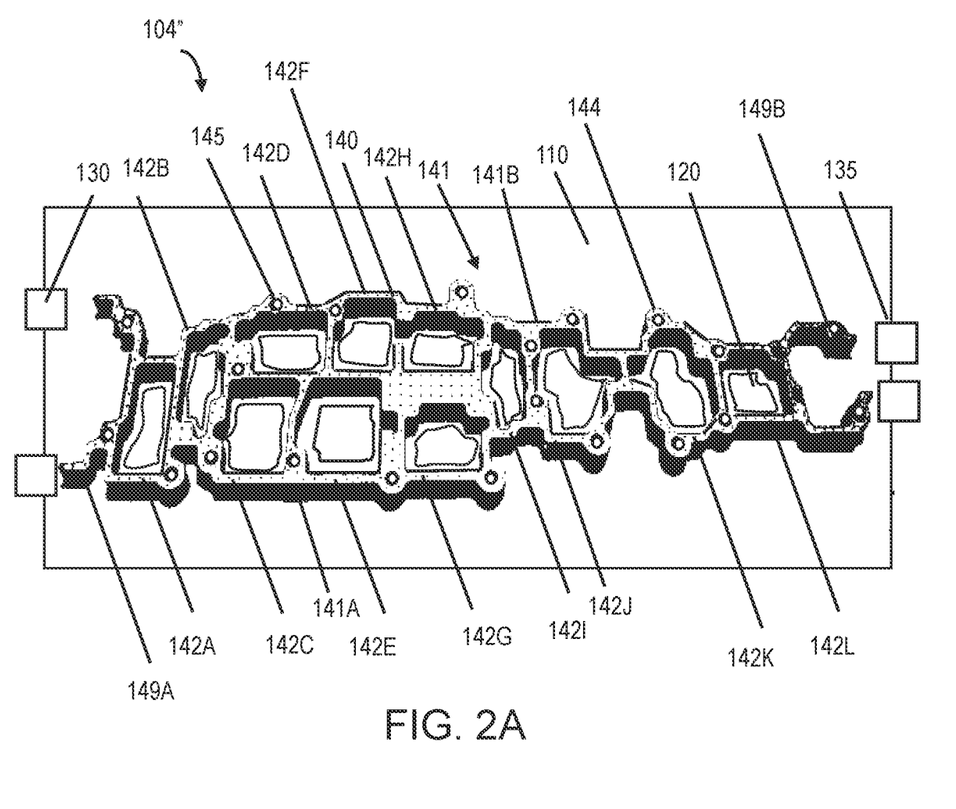
FIG. 2A illustrates a top view of a via fence installed on a ground layer in the front-end RF stage of FIG. 1B.
Figure 2B:
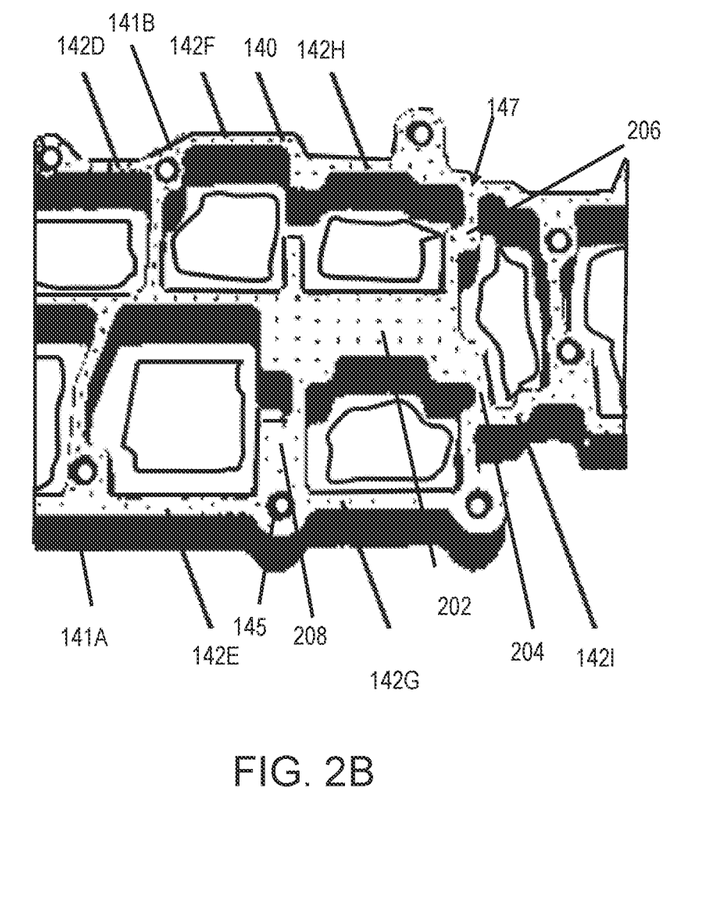
FIG. 2B illustrates a top view of a portion of the via fence installed on the ground layer of FIG. 2A.

FIG. 2A illustrates a top view of a via fence 140 installed outside of the PWB integrating the plurality of circuit modules 120 and onto the ground layer 110 in the front-end RF stage 104'' of FIG. 1B. FIG. 2B illustrates a top view of a portion of the via fence 140 installed on the ground layer of FIG. 2A. The walls of the via fence may be configured to surround the holes of the plurality of cutouts 112.

The via fence 140 may include a fence pattern 141 that is configured to form a wall structure 144 having an individual chamber around each circuit module outside of the PWB. The wall structure 144 has a height H (FIG. 5) above the ground layer 110, as will be discussed in relation to FIG. 5. The wall structure 144 may include a plurality of vias 147 (FIG. 2B) formed through the wall structure 144, such that the via hole is orthogonal to the longitudinal length or parallel to the height H (FIG. 5) of the wall structure 144. The plurality of vias 147 may be spaced at substantially equidistant intervals, for example, along the walls of the wall structure 144. The plurality of vias 147 may be designed to provide a level of frequency isolation. The spacing distance between adjacent vias 147 may be reduced to vary the level of frequency isolation. Alternately or in addition to varying the spacing distance between vias, the size of the vias, such as the radius, may be varied to vary the level of frequency isolation. The spacing at any location of the via fence 140 may vary from another location of the via fence to vary the isolation for different parts of the circuit or for the frequency.

The via fence 140 may be soldered or epoxied to the ground layer 110 of the PWB, in some embodiments. This process of attaching the via fence 140 by solder or epoxy may reduce hardware and installation labor. This attachment process may provide better RF isolation due to having the interface between the walls of the via fence 140 and a circuit card assembly (CCA) fully bonded to minimize any possible leakage paths. The materials of the via fence 140 and/or vias 147 should be selected for a coefficient of thermal expansion (CTE) match with the PWB or CCA.

In the illustration, the wall structure 144 may include a plurality of holes 145. The plurality of holes 145 may be used to affix the wall structure 144 to the ground layer 110 or the CCA using fasteners, such as screws, in lieu of or in addition to the solder or epoxy. The plurality of holes 145, however, are optional. The via fence 140 may be made using standard PWB plating processes and PWB materials unlike machined metal walls that may typically require coating or plating post machining.

As shown in FIG. 2A, the pattern 141 may include via fence chambers 142A-142L, by way of non-limiting example. Each chamber 142A-142L has essentially four walls or wall portions. The pattern 141 may include perimeter fence walls 141A and 141B having a longitudinal dimension. In some embodiments, the fence walls may be straight or linear. In other embodiments, the fence walls may meander along the longitudinal dimension in a free-form shape that may generally conform to the shape of the circuit modules 120, for example.

With reference to via fence chamber 142G in FIG. 2B, a subset of the chambers 142D, 142E, 142F, 142G, 142H and 142I will be described. The chambers 142E, 142G, and 142I may include a portion of perimeter fence wall 141A. The chambers 142DE, 142F, 142H, and 142I may include a portion of perimeter fence wall 141B. The illustration in FIG. 2B illustrates a top surface of the fence walls, where the dots 147 denote locations of vias in the wall. In general, the predetermined minimum width of the fence wall is a function of the size (i.e., radius) of a single via 147. In other words, the width of the fence wall may be at least a width to support the installation of a via 147. In some walls that will include a signal row of vias, the vias may be positioned at a midpoint along the width. The spacing between circuit modules 120 is at least a function of the predetermined minimum width so that the fence 140 can be installed. However, in some embodiments, the spacing between circuit modules 120 may be increased so that the fence wall width can be enlarged to accommodate an increase in the number of vias in the shared interior-fence wall, such as fence wall 208 for an increase in frequency isolation between at least one of chambers 142G and 142H or at least between chambers 142E and 142G. An increase in width of the fence wall at certain locations may be used to accommodate the insertion of (optional) holes 145. The incorporation of the holes 145 into the fence pattern 141 may use a location of intersection corresponding to the intersection of the shared interior-fence walls with one of the perimeter fence walls 141A or 141B, as best seen in FIGS. 2A and 2B. In an embodiment where holes 145 are inserted, the perimeter fence wall 141A or 141B will extend around the hole 145 with the predetermined minimum width to accommodate the spacing distance between the vias in the portion of the fence wall extending around the hole 145. The fence wall at any hole 145 surrounds such hole with at least a width to accommodate a single via. The fence wall that surrounds the hole 145 may have a plurality of vias 147 that are equidistant according to a spacing distance. However, the spacing may be staggered to reduce wall thicknesses and/or increase isolation.

The fence pattern 141 may include an interior-common via fence wall, which is shared by and between adjacent fence chambers. The interior-common via fence wall may have a longitudinal dimension which is generally aligned with the longitudinal dimension of the perimeter fence walls 141A and 141B, but may intersect with shared interior-fence wall 208. In FIG. 2B, via chamber 142I shares a portion of an interior common wall 202 of via fence chamber 142G and a portion of an interior common wall of via fence chamber 142H. The process allows for variation in size and placement of plated thru via holes by altering the drilling pattern of the vias. This allows for tailored isolation where needed for the specific design/frequencies by optimizing the size and location of the individual vias in the wall structure 144.

The plurality of circuit modules 120 have a circuit layout that provides some circuit modules that are generally side-by-side along a first dimension and others circuit modules are generally side-by-side along a second dimension that is perpendicular to the first dimension.

Figure 3:
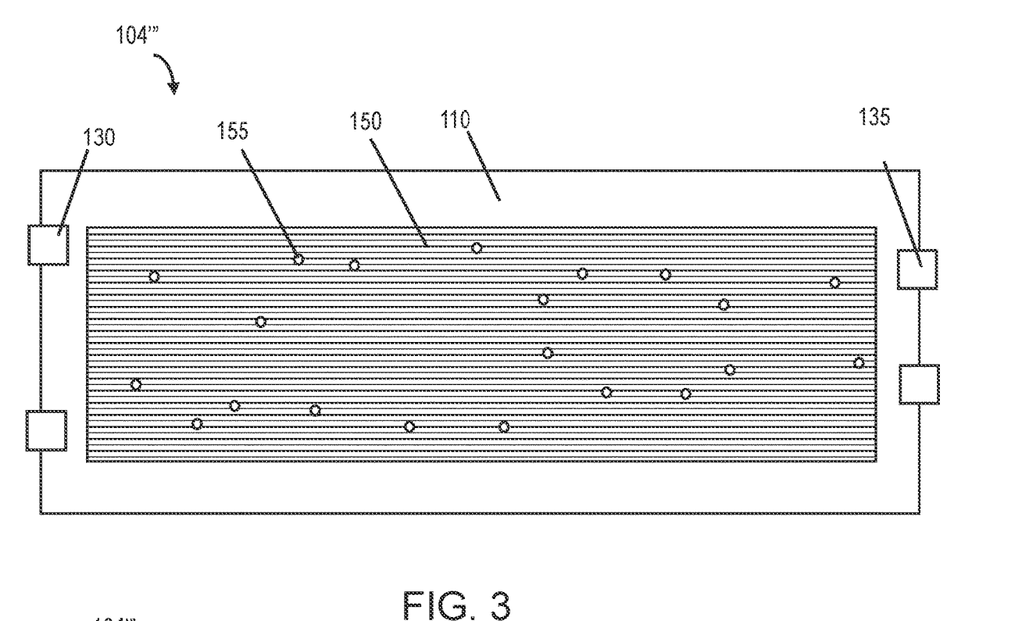
FIG. 3 illustrates a top view of a cover installed on the via fence of the front-end RF stage in accordance with an embodiment.

FIG. 3 illustrates a top view of a cover 150 installed on the via fence 140 of a front-end RF stage 104".

Figure 4:
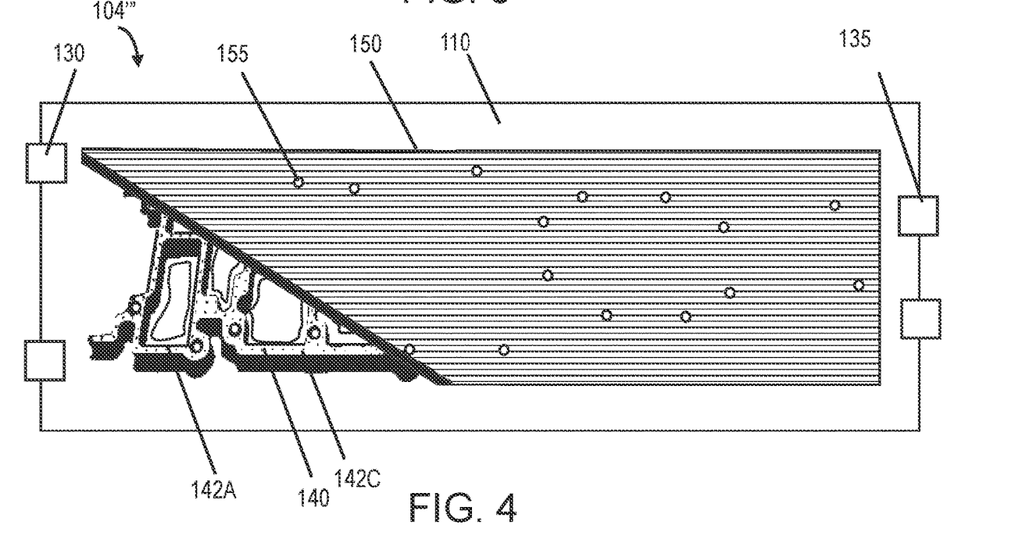
FIG. 4 illustrates a top view of a cover installed on the via fence with a portion removed.

FIG. 4 illustrates a top view of the cover 150 installed on the via fence 140 with a portion removed to see into some of the chambers 142A and 142C. For illustrative purposes, the cover 150 is shown as a rectangular shape planar substrate affixed to the top of the via fence 140. Thus, portions of the cover 150 overhang the perimeter of the via fence 140. The shape of the cover 150, however, may extend to the perimeter with essentially no overhang. The process of attaching the cover 150 to the via fence 140 may be by solder or epoxy. In some embodiments, the cover 150 may be fastened to the via fence 140 using fasteners 155 that are affixed to the via fence 140 by holes 145. However, the fasteners 155 are optional and may be omitted if the holes 145 are omitted. In some embodiments, the shape of the cover 150 may track the perimeter edges of the wall structure 144.

The front-end RF stage 104''' may include a via fence 140 created outside of the PWB together with an affixed cover 150 to form an isolation structure including external three-dimensional (3D) isolation chambers for a pre-designed circuit pattern with signal trace lines. The via fence 140 may include a first material 512 (FIG. 5) that may be a dielectric, which may be a poor conductor of electricity. The dielectric is generally encapsulated with a second material 514 (FIG. 5) that may be a good conductive material, such as Au, Palladium (Pd), Ag, Al or Cu. The term "material" as used in this disclosure may include a single material or a composite of materials.

Figure 5:
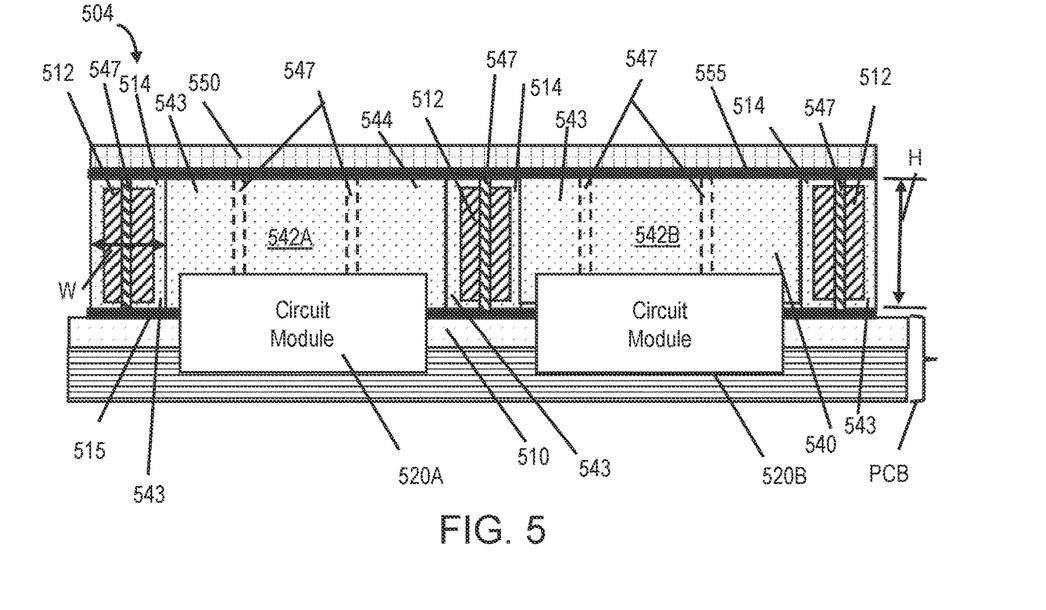
FIG. 5 illustrates a cross-sectional view of a radio frequency device of FIG. 3.
Figure 6:
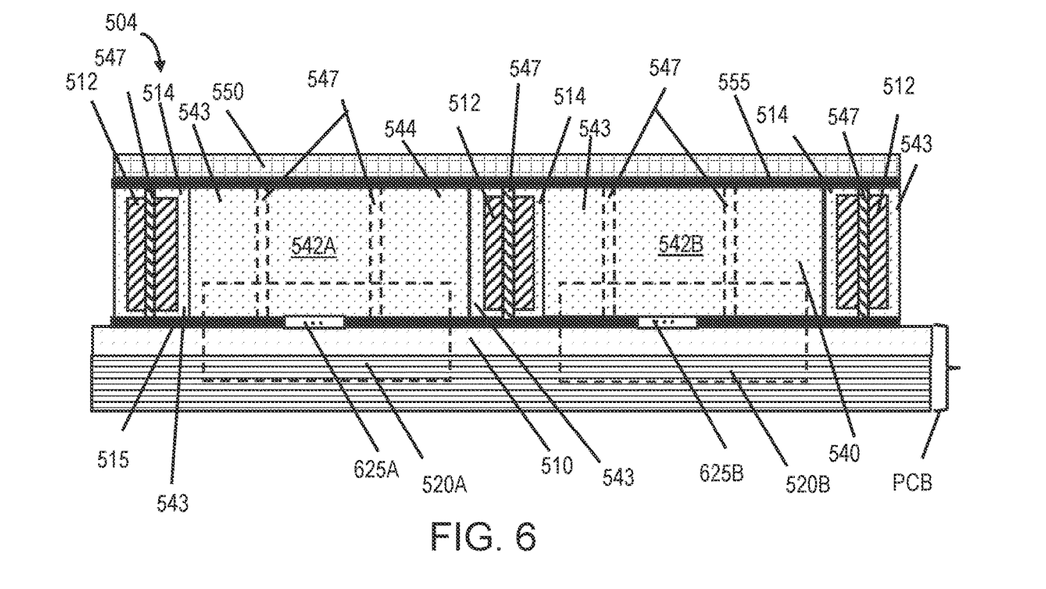
FIG. 6 illustrates a cross-sectional view of a radio frequency device of FIG. 5 with circuit modules shown in phantom.

FIG. 5 illustrates a cross-sectional view of a portion of a front-end RF stage 504. The front-end RF stage 504 includes a printed circuit board (PCB) comprising a radio frequency (RF) circuit. The circuit comprises a plurality of circuit modules (only 520A and 520B shown) and signal trace lines 625A and 625B (FIG. 6). Each circuit module 520A and 520B is electrically connected to at least one other circuit module (not shown) by signal trace lines 625A and 625B (FIG. 6). The front-end RF stage 504 may also include a via fence 540 comprising via fence walls 543 made of at least two materials laminated using a printed wire board (PWB) process. The via fence walls 543 may include a plurality of vias 547 formed therein, the fence walls 543 form a plurality of free-form chambers such as chambers 520A and 520B. Each chamber includes chamber walls (i.e., fence walls 543) that surround each circuit module 520A and 520B, respectively, outside of the PCB. All the walls may have the same general height H. However, as best seen in FIGS. 2A and 2B, the width W may vary, such as to include the number of vias 547 between adjacent chambers.

A portion of the wall structure 544 is shown. One or more of the fence walls 543 may serve as a perimeter wall (i.e., perimeter wall 141A or 141B of FIG. 2A), a shared interior-fence wall (i.e., wall 208 of FIG. 2B) and an interior common wall (i.e., interior common wall 202 of FIG. 2B). The fence walls 543 each includes a first material 512 and a second material 514. The bottom side of the wall structure 544 is affixed to the ground layer 510 via solder or epoxy 515. The layers below the ground layer 510 may include PWB layers that are part of the PCB. The top side of the wall structure 544 may be affixed to the cover 550 via solder or epoxy 555. Each cavity 542A and 542B may be essentially a cavity to provide frequency isolation to reduce a waveguide cavity resonance. The vias 547 are formed in the fence wall 543. Some of the vias 547 are shown in phantom. Each via 547 may be formed by making a hole in the wall and making the via hole conductive. The via 547 may be made by electroplating directly in the drilled via holes. The fence wall and vias are designed also to provide reductions in weight of the circuit and coating or plating cost. Area reduction on the PCB may be gained by removing the fasteners used to attach metal walls.

FIG. 6 illustrates a cross-sectional view of a radio frequency device of FIG. 5 with circuit modules shown in phantom to show the signal trace lines 625A and 625B passing through a pass through the fence wall 543. The second PCB material 514 forms an encapsulating layer surrounding the inner wall of first PCB material 512. The bottom surface of the fence wall eliminates portions of the second PCB material so that those portions are non-conductive by the absence of the conductive second PCB material 514. Furthermore, the solder or epoxy 515 is also absent at those portions so that the signal trace lines provide a conductive electrical path between chambers. Alternately or in addition to, in some embodiments, portions of the conductive material 514 does not require to be removed. For example, the wall provides an opening for the signal trace, the signals can also be connected thru other inner (lower) layers of the PWB making the cavities completely closed.

Figure 7:
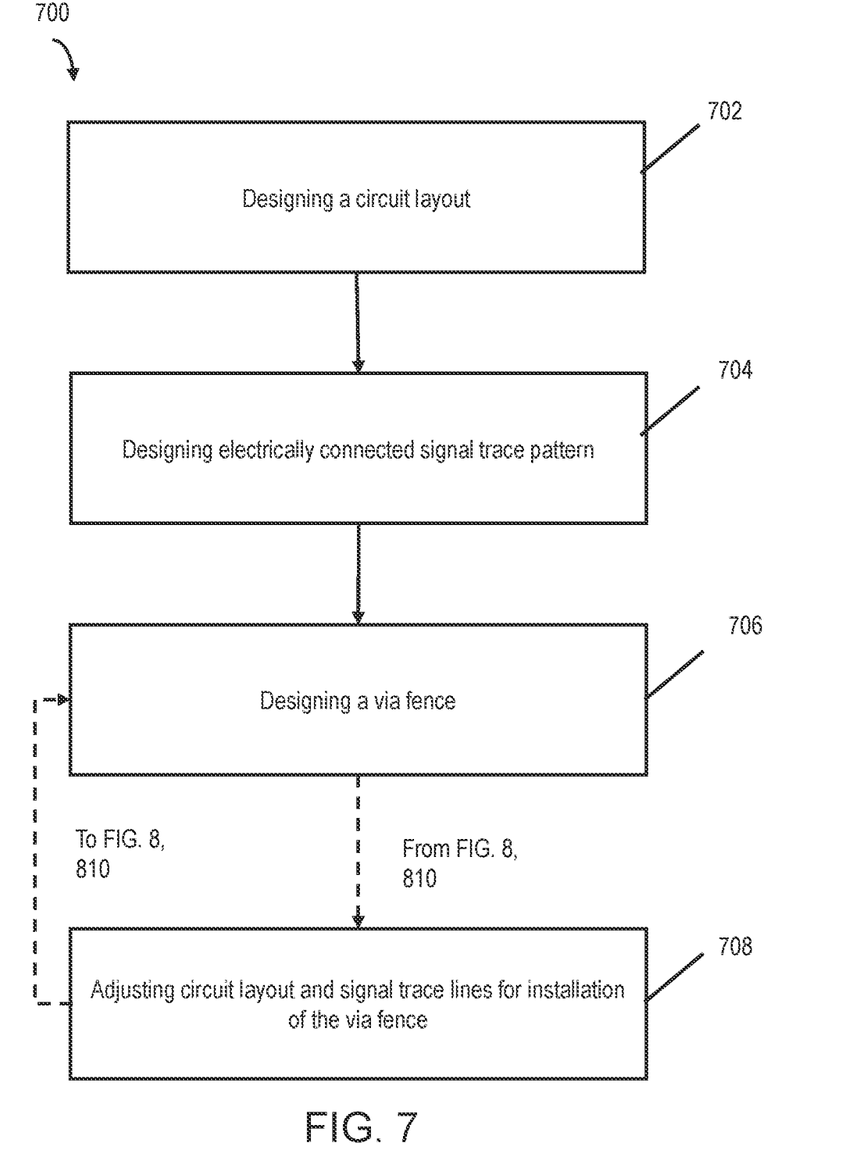
FIG. 7 illustrates a method for designing a radio frequency circuit with an independent via fence.

FIG. 7 illustrates a method 700 for designing a circuit of a front-end RF stage 104 with an independent via fence 140. The method steps may be performed in the order shown or a different order. One or more of the steps may be performed contemporaneously. One or more of the method steps may be omitted and steps may be added. The method steps may be performed using hardware, software, firmware or a combination thereof.

Method 700 may be a computer-implemented method configured to form a printed circuit board (PCB) comprising a radio frequency (RF) circuit, the circuit comprises a plurality of circuit modules and signal trace lines. Each circuit module may be electrically connected to at least one other circuit module by a signal trace line. The method 700 may be a computer-implemented method that is configured to form a via fence comprising fence walls 543 (FIG. 5) having at least two materials laminated using a printed wire board (PWB) process and a plurality of vias 547 (FIG. 5) formed therein. The fence walls 543 form a plurality of free-form chambers. Each chamber includes chamber (fence) walls that surround each circuit module outside of the PCB integrating the circuit modules.

Figure 9:
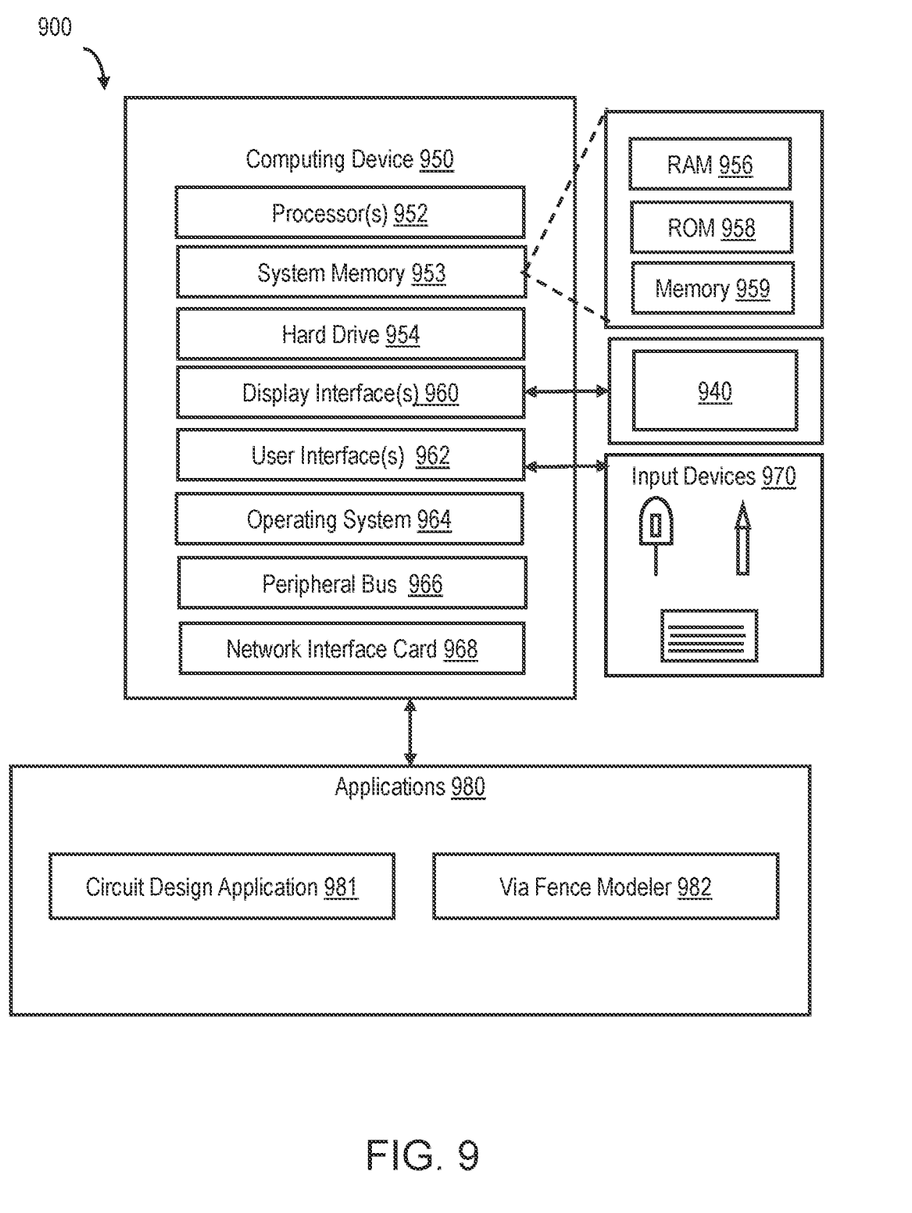
FIG. 9 illustrates a special-purpose computer system.

The method 700 may include (at 702), by at least one processor 1052 (FIG. 9), designing a circuit layout, via a circuit design application 1081 (FIG. 9). The circuit layout, such as shown in FIG. 1B, may include a plurality of circuit modules which collectively when electrically connected are configured as a radio frequency device responsive to at least one frequency or frequency band. The designing of the circuit layout may include displaying on a display device 1040 the circuit layout using a graphical user interface. The graphical user interface may allow a user using an input device 1070 to make adjustments to the circuit layout. Software may include ALLEGRO® by CADENCE® or other electronic design automation (EDA) software.

The method 700 may include (at 704), by at least one processor 1052, designing electrically connected signal trace pattern that is configured to electrically communicate signals from one circuit module to another circuit module using the circuit design application 1081 (FIG. 9), for example. The method 700 may include, (at 705), by at least one processor 952, determining circuit module cutouts in a ground layer using the circuit design application 981 (FIG. 9), for example. The fence walls may be configured to be positioned adjacent to an edge of the cutout such that the entire bottom surface of the fence wall overlaps the metallization of the ground layer 110.

The method 700 may include (at 706), by at least one processor 952, designing a via fence 140 using a via fence modeler 982. The via fence modeler 982 may include computer-aided-design (CAD) application or other software for generating a three-dimensional model. The processor 952 designing the via fence 140 will be described in more detail in FIGS. 8A and 8B. The method 700 may include (at 708), by at least one processor 952, adjusting the circuit layout and signal trace lines for installation of a via fence 140. After adjusting the circuit layout or signal trace lines, the method may return to 706 to complete the designing of the via fence. The via fence location may be driven by the PWB layout software. The tools for RF modelling to determine the via spacing and performance of the isolation walls may include 3D high frequency simulation software, such as by ANYSYS HFSS®, electronic design automation software, such as by Advanced Design System by PATHWAVE® Design, and Microwave Office by CADENCE®.

After the via fence 140 is designed and the adjustments to the circuit layout are complete, the RF front-end stage may be manufactured using standard PWB manufacturing techniques. However, the via fence 140 may be installed outside of the PCB.

Figure 8A:
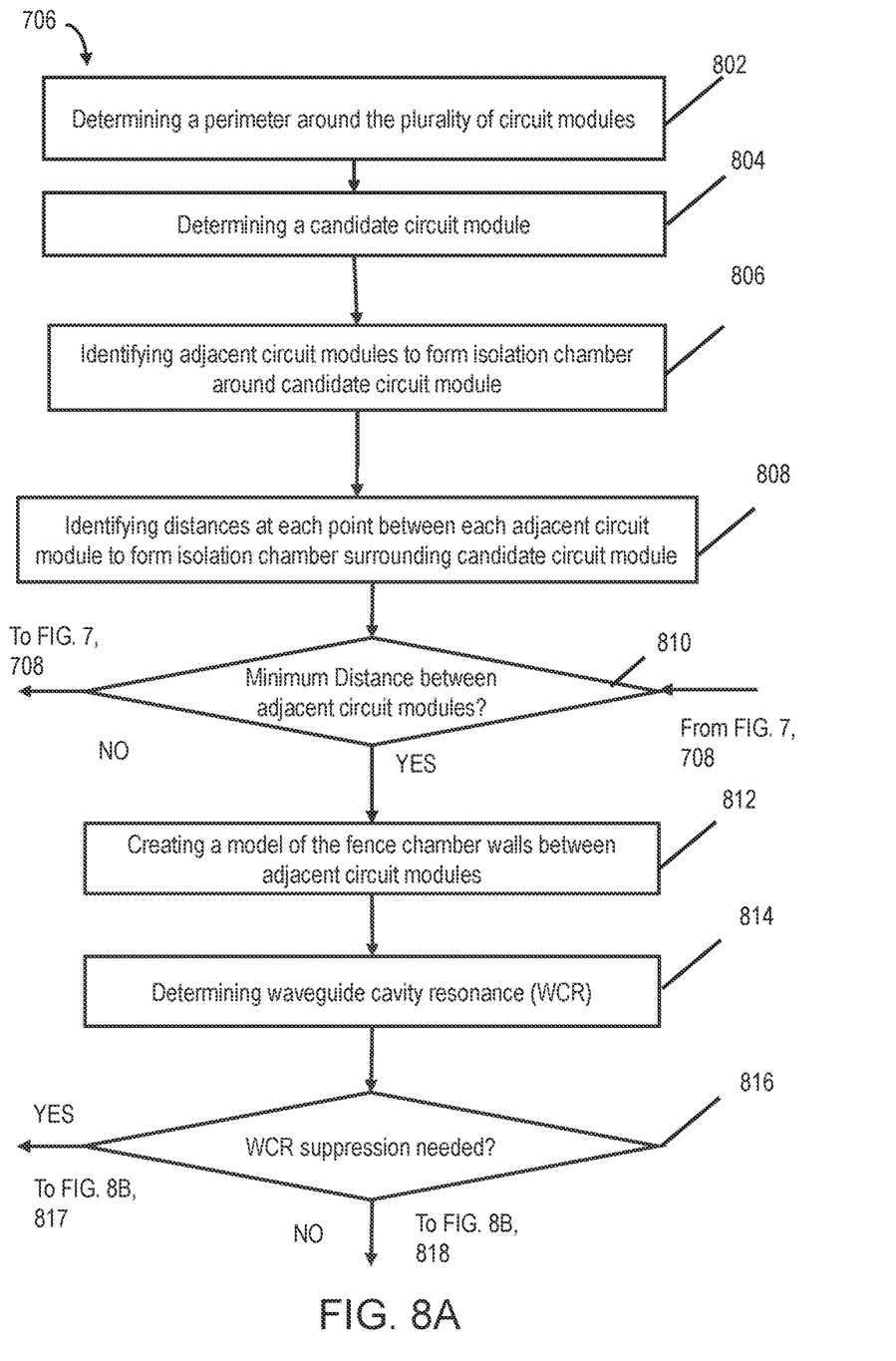
FIGS. 8A and 8B illustrate a method for designing the via fence.
Figure 8B:
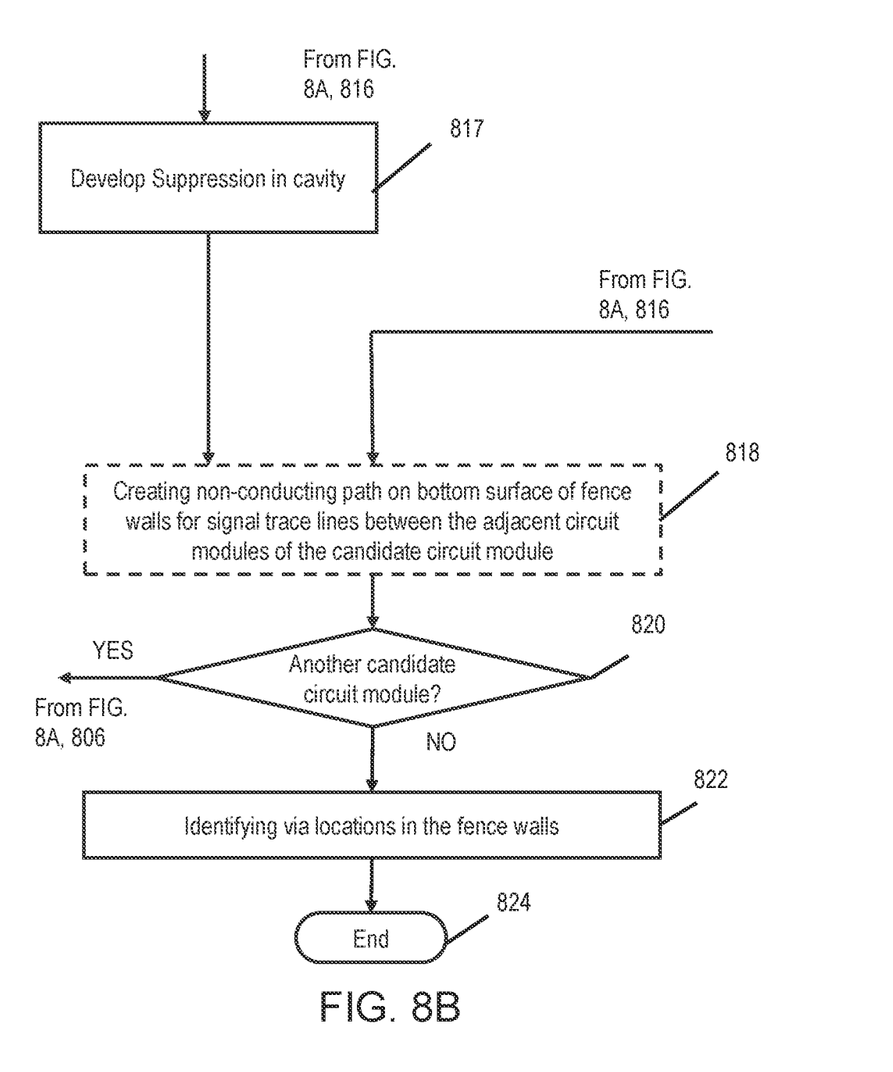

FIGS. 8A and 8B illustrate a method 706 for designing the via fence 140. The method 706 may include (at 802), by the at least one processor 952, determining a perimeter around the plurality of circuit modules 120 (FIG. 1B). The method 706 may include (at 804), by the at least one processor 952, identifying a candidate circuit module of the plurality of circuit modules 120. The method 706 may include (at 806), by the at least one processor 952, identifying adjacent circuit modules to form an isolation chamber that surrounds the candidate circuit module.

The method 706 may include (at 808), by the at least one processor 952, determining distances at each point between an adjacent circuit module and the candidate circuit module to form an isolation chamber that surrounds the candidate circuit module. The method 706 may include (at 810), by the at least one processor 952, determining whether all distances meet a minimum distance. By way of non-limiting example, the minimum distance is based on the via fence wall width W (FIG. 5). As shown in FIGS. 2A and 2B the via fence wall width W may vary from one chamber to the next. However, the width W of the via fence walls should meet or exceed the minimum distance. If the determination (at 810) is "NO," the method 706 may loop to step 708 of FIG. 7, where the circuit layout and/or signal trace lines may be adjusted so that the circuit module locations are adjusted to accommodate the width W of a via fence wall.

If the determination (at 810) is "YES," the method 706 may include (at 812), by the at least one processor 952, creating a model of the fence chamber walls between adjacent circuit modules. The model may include computer-aided-design (CAD) file of the via fence chamber walls. Creating the model may include modeling the via fence chamber walls using at least two materials, as described in FIG. 5. The method 706 may include (at 814), by the at least one processor 952, determining a waveguide cavity resonance (WCR). A cavity resonance occurs inside a conductive enclosure when energy is generated at frequencies which correspond the resonance frequencies of the enclosure. The method 706 may include (at 816), by the at least one processor 952, determining whether the WCR needs suppression. If the determination (at 816) is "NO," the method 706 may proceed to FIG. 8B, at 818. If the determination (at 816) is "YES," the method 706 may proceed to FIG. 8, at 817, so that suppression techniques may be developed.

The WCR may depend on the circuit and frequency of operation. In various embodiments, a change in circuit may be performed to alter the WCR. Other suppression techniques used to suppress these resonances if they occur may include using absorber materials or creating other structures within the cavity. In other examples, absorber materials may be added to walls of the fence or cover 550 that are on the interior of the cavity.

The method 706 may include (at 818), by the at least one processor 952, creating a non-conductive path on the bottom surface of the fence chamber wall for signal trace lines between adjacent circuit modules and the candidate circuit module. The non-conductive path is created by eliminating the layer of conductive material that aligns with the signal trace lines. The box is in dashed lines to denote that it is optional. As described above, in some embodiments, the signal trace lines may be made at lower layers of the PWB.

The method 706 may include (at 820), by the at least one processor 952, determining whether there is another candidate circuit module. If the determination (at 820) is "YES," the method 706 may loop back to step 806 to build another chamber. If the determination (at 820) is "NO," the method 706 may include (at 822), by at least one processor 952, determining via locations in the fence walls to form a via fence 140 and may then end (at 824).

FIG. 9 illustrates a special-purpose computer system 900. The computer system 900 may be in an electronic device, a personal computer, laptop, or a server, for example. The computer system 900 may include a computing device 950, which may also have additional features or functionality. For example, the computing device 950 may also include one or more processors 952 and an operating system 964 stored in a hard device 954. The operating system 964 may be configured as programming instructions which may be executed by the one or more processors 952. The computing device 950 may include additional data storage devices (removable and/or non-removable) such as, for example, magnetic disks, optical disks, or tape. Computer storage media may include volatile and non-volatile, non-transitory, removable and non-removable media implemented in any method or technology for storage of data, such as computer readable instructions, data structures, program modules or other data. System memory 953, removable storage and non-removable storage are all examples of computer storage media. Computer storage media includes, but is not limited to, RAM 956, ROM 958, Electrically Erasable Read-Only Memory (EEPROM), flash memory 959 or other memory technology, compact-disc-read-only memory (CD-ROM), digital versatile disks (DVD) or other optical storage, magnetic cassettes, magnetic tape, magnetic disk storage or other magnetic storage devices, or any other physical medium which can be used to store the desired data and which can be accessed by the computing device. Any such computer storage media may be part of the device. The computer system 900 may include applications 980 including the circuit design application 981 and the via fence modeler 982.

The computing device 950 may also include or have user interfaces 962 for user input device(s) 970 such as a keyboard, mouse, pen, voice input device, touch input device, etc. The computing device 950 may include or have display interfaces 960 for connection to output device(s) such as at least one display device 940 via display drivers, speakers, etc. The computing device 950 may include a peripheral bus 966 for connecting to peripherals. The computing device 950 may contain communication connection(s) that allow the communication systems to communicate with other computing devices, such as over a network or a wireless network. By way of example, and not limitation, communication connection(s) and protocols may be compatible with wired media such as a wired network or direct-wired connection, and wireless media such as acoustic, radio frequency (RF), infrared and other wireless media of the communication system. The computing device 950 may include a network interface card 968 to connect (wired or wireless) to a network.

Computer program code for carrying out operations described above may be written in a variety of programming languages, including but not limited to a high-level programming language, such as C or C++, for development convenience. In addition, computer program code for carrying out operations of embodiments described herein may also be written in other programming languages, such as, but not limited to, interpreted languages. The program code may include hardware description language (HDL) or very high speed integrated circuit (VHSIC) hardware description language, such as for firmware programming. Some modules or routines may be written in assembly language or even micro-code to enhance performance and/or memory usage. It will be further appreciated that the functionality of any or all of the program modules may also be implemented using hardware, software, firmware or a combination thereof. For example, the program modules may be implemented using discrete hardware components, one or more application specific integrated circuits (ASICs), or a programmed Digital Signal Processor (DSP) or microcontroller. A code in which programming instructions of the embodiments are described can be included as a firmware in a RAM, a ROM and a flash memory. Otherwise, the code can be stored in a non-transitory, tangible computer-readable storage medium such as a magnetic tape, a flexible disc, a hard disc, a compact disc, a photo-magnetic disc, a digital versatile disc (DVD) or the like and subsequently executed by the one or more processors.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising." Moreover, unless specifically stated, any use of the terms first, second, etc., does not denote any order or importance, but rather the terms first, second, etc., are used to distinguish one element from another.

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While various disclosed embodiments have been described above, it should be understood that they have been presented by way of example only, and not limitation. Numerous changes, omissions and/or additions to the subject matter disclosed herein can be made in accordance with the embodiments disclosed herein without departing from the spirit or scope of the embodiments. Also, equivalents may be substituted for elements thereof without departing from the spirit and scope of the embodiments. In addition, while a particular feature may have been disclosed with respect to only one of several implementations, such feature may be combined with one or more other features of the other implementations as may be desired and advantageous for any given or particular application. Furthermore, many modifications may be made to adapt a particular situation or material to the teachings of the embodiments without departing from the scope thereof.

Further, the purpose of the foregoing Abstract is to enable the U.S. Patent and Trademark Office and the public generally and especially the scientists, engineers and practitioners in the relevant art(s) who are not familiar with patent or legal terms or phraseology, to determine quickly from a cursory inspection the nature and essence of this technical disclosure. The Abstract is not intended to be limiting as to the scope of the present disclosure in any way.

Therefore, the breadth and scope of the subject matter provided herein should not be limited by any of the above explicitly described embodiments. Rather, the scope of the embodiments should be defined in accordance with the following claims and their equivalents.

We claim:

1. A system, comprising:
   a printed circuit board (PCB) comprising a radio frequency (RF) circuit, the circuit comprises a plurality of circuit modules and signal trace lines, each circuit module being electrically connected to at least one other circuit module by a signal trace line; and
   a via fence comprising fence walls having at least two materials laminated using a printed wire board (PWB) process and a plurality of vias formed therein, the fence walls form a plurality of free-form RF isolation chambers, each chamber includes chamber walls that surround each circuit module outside of the PCB wherein:
   the at least two materials comprise a first material and a second material;
   the PCB comprises a ground layer; and
   the fence walls comprise:
      an inner wall made of the first material; and
      an encapsulating layer surrounding the inner wall, made of the second material different from the first material and electrically connected to the ground layer.

2. The system of claim 1, wherein the RF circuit comprises an RF receiver, an RF transmitter or an RF transceiver.

3. The system of claim 1, wherein the fence walls comprise:
   a top surface; and
   a bottom surface affixed to the PCB; and
   further comprising:
      a cover affixed to the top surface such that one or more of the chambers form a closed cavity.

4. The system of claim 3, wherein each closed cavity is configured to reduce waveguide cavity resonance.

5. The system of claim 1, wherein:
   the fence walls comprise a bottom surface that is configured to be affixed to the ground layer;
   the bottom surface includes non-conductive sections at locations where the encapsulating layer is absent; and
   the signal trace line that electrically connects two adjacent circuit modules passes through the non-conductive section.

6. The system of claim 5, further comprising solder or epoxy configured to affix the encapsulating layer to the ground layer.

7. The system of claim 6, wherein:
   the ground layer comprises a plurality of cutouts forming holes in the ground layer;
   each cutout is configured to receive therethrough a corresponding circuit module that resides above a plane of the ground layer; and
   the fence walls are configured to surround the holes of the plurality of cutouts.

8. The system of claim 1, wherein:
   the plurality of circuit modules has a circuit pattern having spacing distances between adjacent circuit modules; and
   wherein the fence walls have a coefficient of thermal expansion (CTE) that matches the PCB.

9. A method, comprising:
   forming a printed circuit board (PCB) comprising a radio frequency (RF) circuit, the circuit comprises a plurality of circuit modules and signal trace lines, each circuit module being electrically connected to at least one other circuit module by a signal trace line;
   forming a via fence comprising fence walls having at least two materials laminated using a printed wire board (PWB) process and a plurality of vias formed therein, the fence walls form a plurality of free-form chambers, each chamber includes chamber walls that surround each circuit module outside of the PCB;
   fabricating the PCB with a ground layer;
   fabricating the fence walls with a first material and a second material, wherein the fence walls comprise:
      an inner wall made of the first material, and
      an encapsulating layer surrounding the inner wall, made of the second material different from the first material; and
   electrically connecting the encapsulating layer to the ground layer.

10. The method of claim 9, wherein the RF circuit comprises an RF receiver, an RF transmitter or an RF transceiver.

11. The method of claim 9, wherein forming the via fence comprises:
    forming a top surface; and
    forming a bottom surface to affix to the PCB; and
    the method further comprising:
       forming a cover configured to be affixed to the top surface such that one or more of the chambers form a closed cavity.

12. The method of claim 11, further comprising:
    designing each closed cavity to reduce a waveguide cavity resonance.

13. The method of claim 9, wherein:
    electrically connecting the encapsulating layer to the ground layer comprises affixing a bottom surface of the fence wall to the ground layer, the bottom surface includes non-conductive sections at locations where the encapsulating layer is absent; and
    the method further comprising:
    passing through the non-conductive sections the signal trace line that electrically connects two adjacent circuit modules.

14. The method of claim 13, further comprising:
    soldering or epoxying the encapsulating layer to the ground layer.

15. The method of claim 14, further comprising:
    forming in the ground layer a plurality of cutouts forming holes in the ground layer;
    receiving in each cutout a corresponding circuit module that resides above a plane of the ground layer; and
    affixing the fence walls to the ground layer so that the fence walls surround the holes of the plurality of cutouts.

16. The method of claim 9, wherein:
   the plurality of circuit modules having a circuit pattern having spacing distances between adjacent circuit modules; and
   the method further comprising:
      determining whether each spacing distance between adjacent circuit modules is equal to or greater than a predetermined minimum width of the fence walls; and
      in response to determining that at least one spacing distance is less than the predetermined minimum width, adjusting the circuit pattern.

17. The method of claim 9, the method further comprising:
   forming via holes in the fence walls; and
   wherein the fence walls have a coefficient of thermal expansion (CTE) that matches the PCB.

18. The method of claim 9, wherein forming the via fence comprises forming free-form RF isolation chambers.

* * * * *